United States Patent [19]

Chien

[11] Patent Number: 6,158,707
[45] Date of Patent: Dec. 12, 2000

[54] CPU HEAT SINK FASTENING DEVICE

[76] Inventor: Sen-Jong Chien, No. 604-1, Sung Shan Road, 1 Floor, Taipei, Taiwan

[21] Appl. No.: 08/946,199

[22] Filed: Oct. 7, 1997

[51] Int. Cl.[7] .................................................. A47B 97/00
[52] U.S. Cl. ........................... 248/510; 248/505; 361/704
[58] Field of Search ..................................... 248/505, 684, 248/680, 681, 225.11, 225.21, 300, 301, 510; 165/80.3, 185; 257/718, 719; 361/704, 707; 174/16.3

[56] References Cited

U.S. PATENT DOCUMENTS

| | | | |
|---|---|---|---|
| 5,396,402 | 3/1995 | Perugini et al. | 361/704 |
| 5,486,981 | 1/1996 | Blomquist | 361/704 |
| 5,600,540 | 2/1997 | Blomquist | 361/704 |
| 5,602,719 | 2/1997 | Kinion | 361/704 |
| 5,617,292 | 4/1997 | Steiner | 361/704 |
| 5,771,155 | 6/1998 | Cook | 361/710 |
| 5,791,403 | 8/1998 | Chiou | 165/80.3 |
| 5,828,553 | 10/1998 | Chiou | 361/704 |
| 5,873,406 | 2/1999 | Horng | 165/80.3 |

*Primary Examiner*—Leslie A. Braun
*Assistant Examiner*—Gwendolyn Baxter
*Attorney, Agent, or Firm*—Dougherty & Troxell

[57] ABSTRACT

A heat sink fastening device integrally made from a metal plate by stamping and fastened to a mount to hold down a heat sink on a (Central Processing Unit) in the mount, the device having an elongated base strip forced into engagement with a middle transverse groove at a top side of said heat sink, a hooked first coupling strip extended downwardly from a first end of the elongated base strip and hooked up with a retainer block at a first side of the CPU mount, a hooked second coupling strip extended downwardly from a second end of the elongated base strip remote from the first coupling strip and hooked up with a retainer block at a second side of the CPU mount opposite to its first side, a finger strip extended from the second end of the elongated base strip for turning by hand to force the second coupling strip inwards and outwards, and two curved connecting strips connected between the elongated base strip and the finger strip and spaced from two second coupling strip at two opposite sides.

12 Claims, 5 Drawing Sheets

CPU HEAT SINK FASTENING DEVICE

BACKGROUND OF THE INVENTION

The present invention relates to a heat sink fastening device integrally made from a metal plate by stamping and adapted for fastening to a mount to hold down a heat sink on a CPU (Central Processing Unit) in the mount. The CPU heat sink comprises an elongated base strip adapted for fastening to a middle transverse groove of the CPU mount, a hooked first coupling strip extended from a first end of the elongated base strip and adapted for hooking up with a retainer block at a first side of the CPU mount, a hooked second coupling strip extended from a second opposite end of the elongated base strip and adapted for hooking up with a retainer block at a second side of the CPU mount, and a finger strip extended from the elongated base strip adjacent the second coupling strip for operation by hand to move the second coupling strip in and out of the engagement position.

When a CPU of a computer system in operation, heat must be quickly carried away. Various heat sinks have been disclosed for dissipating heat from a CPU. When a heat sink is used, a fastening device must be installed to secure the heat sink to the CPU mount and the CPU in the CPU mount. FIG. 6 shows a CPU heat sink fastening device 90 mounted in a transverse groove 81 of a heat sink 80 and fastened to two retainer blocks 61 at two opposite sides of a CPU mount 60 to hold down a heat sink 80 on a CPU 70 in the CPU mount 60. When installed, the finger strips 91 of the fastening device 90 are closely attached to the radiating fins of the heat sink 80. Therefore, the finger strips 91 cannot be conveniently grasped by hand to disconnect the fastening device 90 from the CPU mount 60. FIG. 7 shows another structure of CPU heat sink fastening device 50 according to the prior art. This structure of fastening device 50 is made from a steel plate by stamping. When in use, one end of the fastening device 50 is pressed on the heat sink 80 at the top, and the other end of the fastening device 50 is hooked up with a retainer block at one side of the CPU mount. This structure of CPU heat sink fastening device is not satisfactory in function because it covers a part of the heat sink, and the covered area of the heat sink will be unable to dissipate heat quickly.

SUMMARY OF THE INVENTION

It is one object of the present invention to provide a CPU heat sink fastening device which is made from a metal plate in integrity. It is another object of the present invention to provide a CPU heat sink fastening device which can be quickly installed to hold down a heat sink firmly on a CPU in a CPU mount. It is still another object of the present invention to provide a CPU heat sink fastening device which can be conveniently dismounted from the heat sink and the CPU mount. According to one aspect of the present invention, the CPU heat sink fastening device comprises an elongated base strip forced into engagement with a middle transverse groove at a top side of said heat sink, a first coupling strip extended downwardly from a first end of the elongated base strip and hooked up with a retainer block at a first side of the CPU mount, a second coupling strip extended downwardly from a second end of the elongated base strip remote from the first coupling strip and hooked up with a retainer block at a second side of the CPU mount opposite to its first side, and a finger strip extended from the second end of the elongated base strip for turning by hand to force the second coupling strip inwards and outwards. According to another aspect of the present invention, two curved connecting strips are bilaterally connected between the finger strip and the elongated base strip. According to still another aspect of the present invention a supporting strip is connected between the finger strip and the second coupling strip and suspended between the connecting strips. According to still another aspect of the present invention, an arched springy portion is connected between the elongated base strip and the second coupling strip.

DETAILED DESCRIPTION OF THE PREFERRED EMBODIMENT

Figure 1:
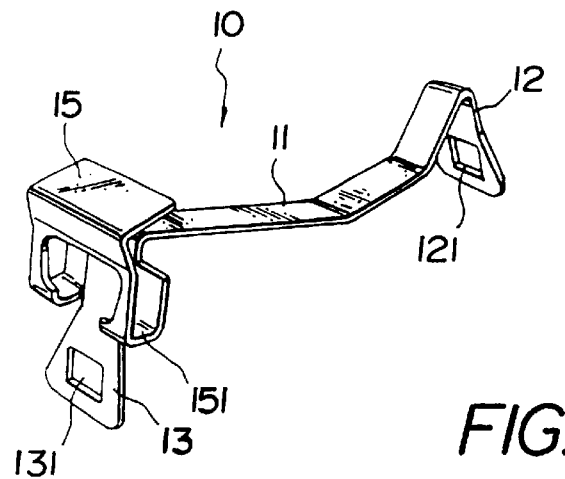
FIG. 1 shows a CPU heat sink fastening device according to one embodiment of the present invention.

Referring to FIG. 1, the CPU heat sink fastening device, referenced by 10, comprises an elongated base strip 11, a first coupling strip 12 downwardly outwardly extended from a first end of the elongated base strip 11, a first retaining hole 121 at one end of the coupling strip 12 remote from the elongated base strip 11, a finger strip 15, two curved connecting strips 151 bilaterally connected between the finger strip 15 and a second end of the elongated base strip 11 remote from the first coupling strip 12, a second coupling strip 13 downwardly outwardly extended from the second end of the elongated base strip 11 remote from the first coupling strip 12 and spaced between the curved connecting strips 151, and a second retaining hole 131 at one end of the second coupling strip 12 remote from the elongated base strip 11. When the elongated base strip 11 of the fastening device 10 is mounted in a middle transverse groove 21 of a heat sink 20, the retaining holes 121; 131 of the coupling strips 12; 13 are respectively fastened to respective retainer blocks at two opposite sides of a CPU mount 40 to secure the heat sink 20 to the CPU mount 40, permitting the CPU 30 to be firmly retained in contact with the bottom side of the heat sink 20 (see also FIG. 4).

Figure 2:
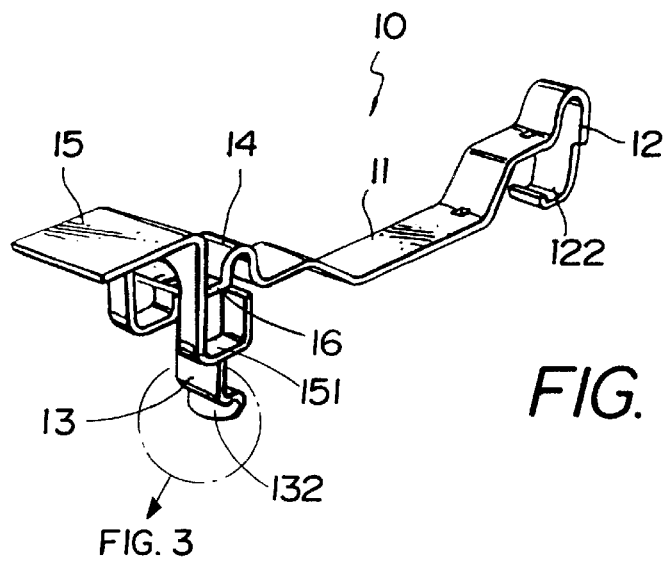
FIG. 2 shows an alternate form of the CPU heat sink fastening device according to the present invention.
Figure 3:
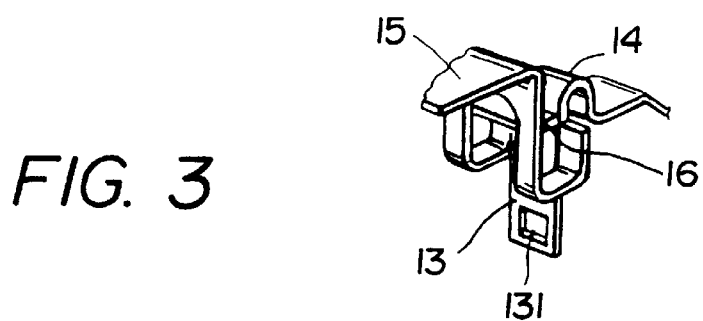
FIG. 3 shows another alternate form of the present invention.

FIG. 2 show an alternate form of the CPU heat sink fastening device 10. According to this alternate form, the CPU heat sink fastening device 10 comprises an elongated base strip 11, a first coupling strip 12 downwardly extended from a first end of the elongated base strip 11 and terminating in a hook 122, a second coupling strip 13 downwardly extended from a second opposite end of the elongated base strip 11 remote from the first coupling strip 12 and terminating in a hook 132, an arched springy portion 14 connected between the elongated base strip 11 and the second coupling strip 13, a finger strip 15 extended from the connecting area between the second coupling strip 13 and the arched springy portion 14, two connecting strips 151 bilaterally connected between the finger strip 15 and arched springy portion 14, and a supporting strip 16 connected between the finger strip 15 and the second coupling strip 13 and suspended between the connecting strips 151. Alternatively, the second coupling strip 13 can be made having a retaining hole 131 for fastening to the CPU mount.

Figure 4:
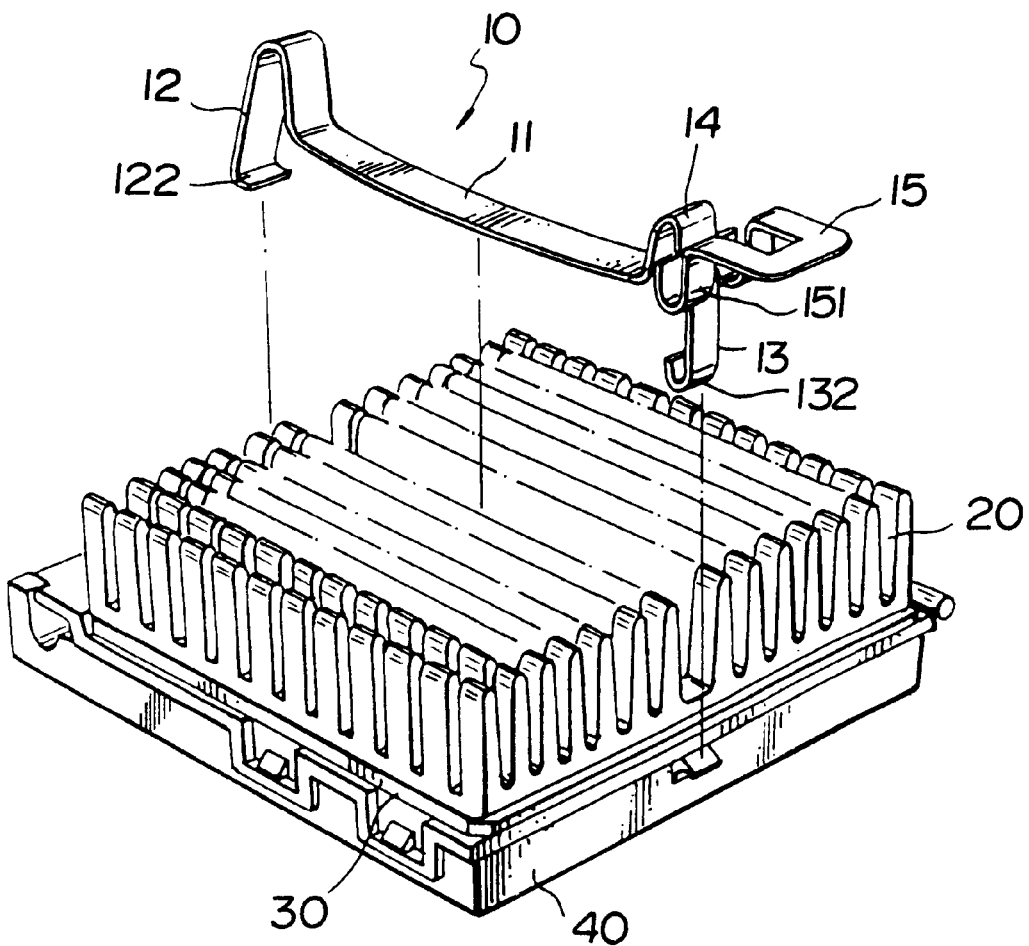
FIG. 4 shows the relationship between the CPU heat sink fastening device and the heat sink on the CPU in the CPU mount according to the present invention.
Figure 5:
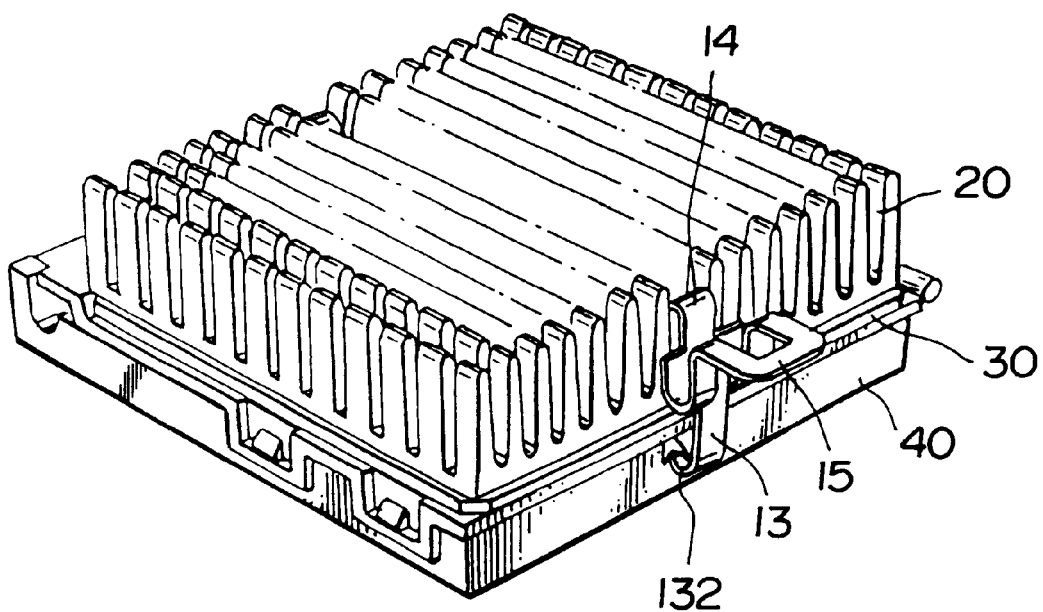
FIG. 5 shows the CPU heat sink fastening device fastened to the heat sink and the CPU mount according to the present invention.
Figure 6:
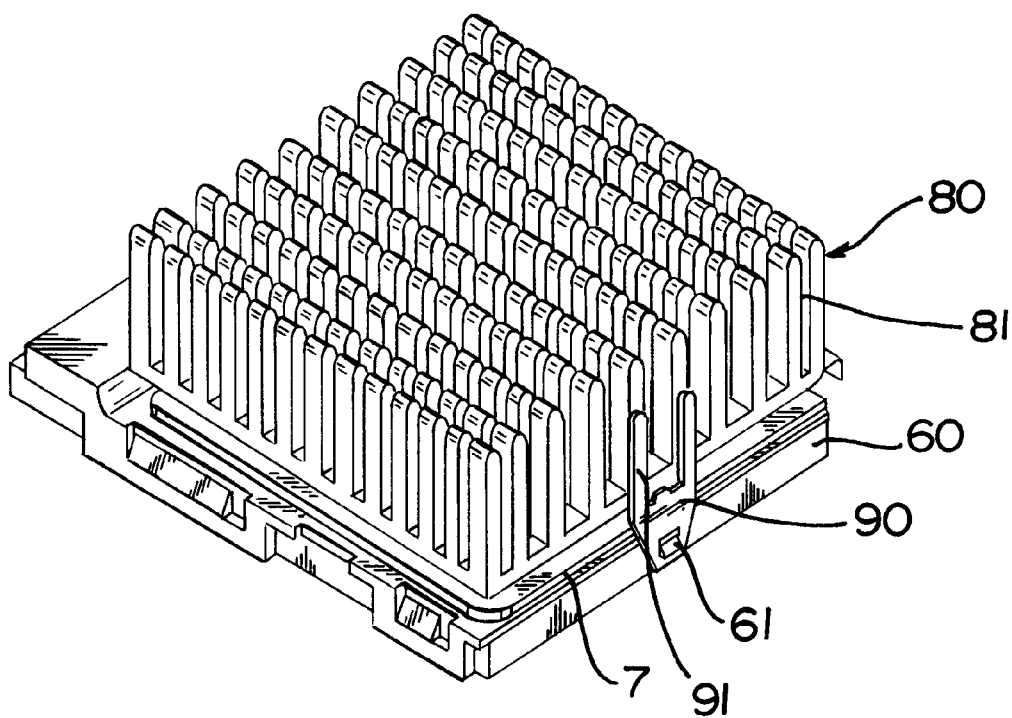
FIG. 6 is an installed view of a CPU heat sink fastening device according to the prior art.
Figure 7:
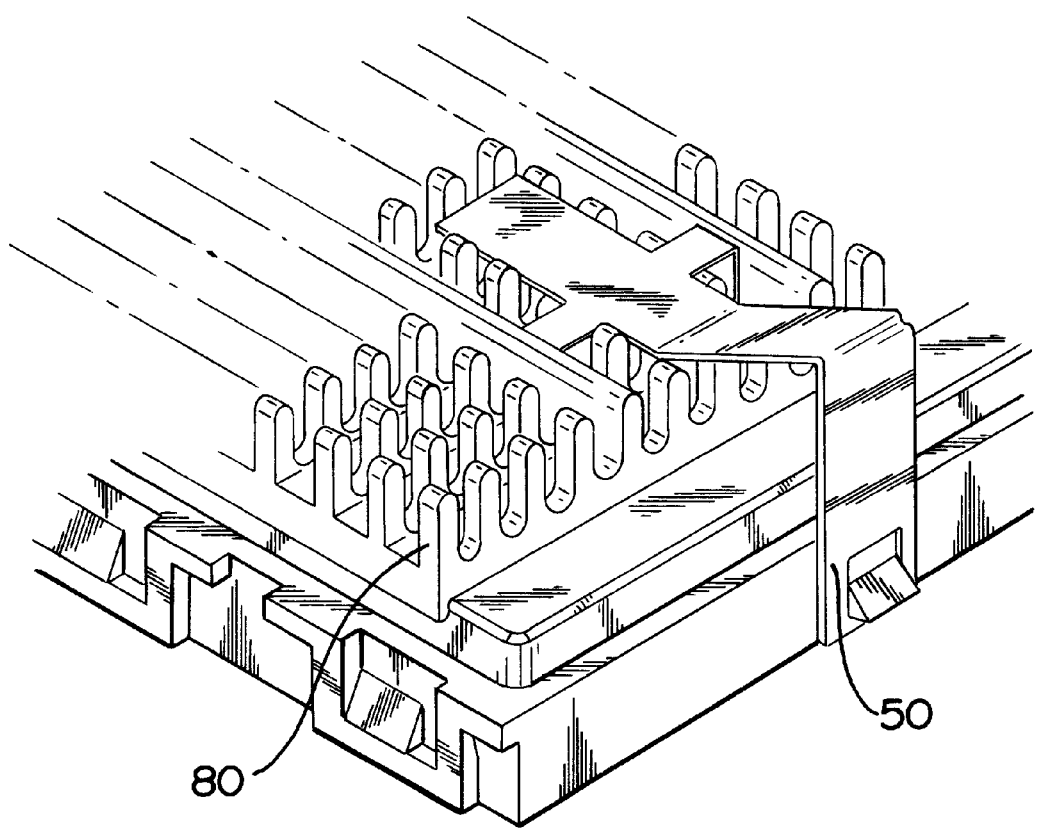
FIG. 7 is an installed view of another structure of CPU heat sink fastening device according to the prior art.

Referring to FIGS. 4 and 5, when the heat sink 20 is attached to the top side of the CPU 30 in the CPU mount 40, the hook 122 of the first coupling strip 12 of the fastening device 10 is hooked on a retainer block at one side of the CPU mount 40, then the elongated base strip 11 is forced into engagement with the middle transverse groove 21 of the heat sink 20, and then the finger strip 15 is depressed by hand to tilt the second coupling strip 13 to a certain position. When the finger strip 15 is released, the hook 132 of the second coupling strip 13 is automatically forced into engagement with one retainer block at an opposite side of the CPU mount 40.

It is to be understood that the drawings are designed for purposes of illustration only, and are not intended as a definition of the limits and scope of the invention disclosed.

What the invention claimed is:

1. A heat sink fastening device for holding down a heat sink on a CPU (Central Processing Unit) in a CPU mount, the fastening device comprising:
   an elongated base strip with a first end and a second end;
   a first coupling strip extending downwardly from the first end of the elongated base strip;
   a second coupling strip extending downwardly from the second end of the elongated base strip;
   two curved connecting strips bilaterally extending from the second end of the elongated base strip; and
   a finger strip extending from the two connecting strips and being arranged to move the second coupling strip inwards and outwards when manipulated by hand;
   wherein the elongated base strip, the first and second coupling strips, the two curved connecting strips and the finger strip are integrally formed from a metal plate.

2. The heat sink fastening device according to claim 1, wherein the first and second coupling strips each having a respective retaining hole formed therein.

3. The heat sink fastening device according to claim 1, wherein the first and second coupling strips each have a respective bottom end terminating in a hook.

4. The heat sink fastening device according to claim 1, further comprising:
   a supporting strip connected between the finger strip and the second coupling strip and suspended between the two connecting strips.

5. The heat sink fastening device according to claim 4, wherein the first and second coupling strips each have a respective retaining hole formed therein.

6. The heat sink fastening device according to claims 4, wherein the first and second coupling strips each have a respective bottom end terminating in a hook.

7. The heat sink fastening device according to claim 4, wherein the second end of the elongated base strip includes an arched springy portion from which the second coupling strip extends.

8. The heat sink fastening device according to claim 7, wherein the first and second coupling strips each have a respective retaining hole formed therein.

9. The heat sink fastening device according to claim 7, wherein the first and second coupling strips each have a respective bottom end terminating in a hook.

10. The heat sink fastening device according to claim 1, wherein the second end of the elongated base strip includes an arched springy portion from which the second coupling strip extends.

11. The heat sink fastening device according to claim 10, wherein the first and second coupling strips each have a respective retaining hole formed therein.

12. The heat sink fastening device according to claim 10, wherein the first and second coupling strips each have a respective bottom end terminating in a hook.

* * * * *